United States Patent
Higuchi et al.

(10) Patent No.: US 6,818,989 B2
(45) Date of Patent: Nov. 16, 2004

(54) BGA TYPE SEMICONDUCTOR DEVICE, TAPE CARRIER FOR SEMICONDUCTOR DEVICE, AND SEMICONDUCTOR DEVICE USING SAID TAPE CARRIER

(75) Inventors: Akifumi Higuchi, Ibaraki (JP); Toyoharu Koizumi, Ibaraki (JP); Norihiro Ashizuka, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/000,791

(22) Filed: Dec. 4, 2001

(65) Prior Publication Data

US 2002/0171145 A1 Nov. 21, 2002

(30) Foreign Application Priority Data

May 21, 2001 (JP) ........................... 2001-151110

(51) Int. Cl.[7] ................. H01L 23/48; H01L 23/52; H01L 29/40
(52) U.S. Cl. ............... 257/738; 257/666; 257/698; 257/778; 257/781
(58) Field of Search ................. 257/738, 666, 257/667, 673, 676, 773, 774, 776, 784, 684, 698, 778, 678, 781

(56) References Cited

U.S. PATENT DOCUMENTS

| | | | | |
|---|---|---|---|---|
| 5,376,588 A | * | 12/1994 | Pendse | 156/293 |
| 5,592,736 A | * | 1/1997 | Akram et al. | 29/841 |
| 5,717,252 A | * | 2/1998 | Nakashima et al. | 257/707 |
| 5,998,241 A | * | 12/1999 | Niwa | 438/122 |
| 6,051,450 A | * | 4/2000 | Ohsawa et al. | 438/123 |
| 6,144,102 A | * | 11/2000 | Amagai | 257/781 |
| 6,333,564 B1 | * | 12/2001 | Katoh et al. | 257/780 |

FOREIGN PATENT DOCUMENTS

| | | | | |
|---|---|---|---|---|
| JP | 05-067698 | | 3/1993 | ........ H01L/23/28 |
| JP | 06169033 A | * | 6/1994 | |
| JP | 11-040694 | | 2/1999 | ........ H01L/23/12 |
| JP | 11087434 A | * | 3/1999 | |
| JP | 2000031323 A | * | 1/2000 | |

* cited by examiner

Primary Examiner—Tom Thomas
Assistant Examiner—Chris Chu
(74) Attorney, Agent, or Firm—Antonelli, Terry, Stout & Kraus, LLP

(57) ABSTRACT

In a BGA type semiconductor device wherein, while leaving a via hole for a solder ball, an insulating film formed of a photosolder resist (PSR) is provided on a tape substrate on its side where a wiring pattern is provided, a groove portion is provided between a bonding wire sealing portion and the via hole for a solder ball. The groove portion is a smaller-thickness portion of the insulating film provided as a part of the insulating film. By virtue of this construction, at the time of sealing of a wire bonding connection with a mold resin, the flow of the mold resin into the via hole for a solder ball can be prevented.

14 Claims, 14 Drawing Sheets

BGA TYPE SEMICONDUCTOR DEVICE, TAPE CARRIER FOR SEMICONDUCTOR DEVICE, AND SEMICONDUCTOR DEVICE USING SAID TAPE CARRIER

BACKGROUND OF THE INVENTION

1. Field of the Invention

The invention relates to a BGA (ball grid array) type semiconductor device using a TAB (tape automated bonding) tape or the like as an interposer between an LSI chip and an external terminal, a tape carrier for a semiconductor device, and a semiconductor device using said tape carrier. More particularly, the invention relates to a BGA type semiconductor device of the so-called "PSR via type" wherein an insulating film of a photosolder resist (PSR) has been provided on a side, where a wiring pattern is provided, while leaving via holes (PSR via) for solder balls, a tape carrier for a semiconductor device, and a semiconductor device using the same.

2. Prior Art

In recent years, in various types of equipment using semiconductor devices, including particularly portable equipment and mobile equipment, a reduction in size and a reduction in weight have been advanced. Therefore, regarding semiconductor devices used in these types of equipment as well, there is a demand for a reduction in size and a reduction in thickness. To meet this demand, in recent years, packages having substantially the same size as semiconductor elements, called "chip-size packages" (hereinafter abbreviated to "CSP"), have been proposed, and efforts have been made to commercialize semiconductor devices using these packages.

A BGA (ball grid array) type semiconductor device using a TAB tape as an interposer is shown as a representative example of these semiconductor devices in FIGS. 1 and 2.

This device is a BGA type semiconductor device of the so-called "PSR via type" wherein, while leaving via holes 12 for solder balls (PSR via), an insulating film 2 composed of a photosolder resist (PSR) is provided on a tape substrate 5, composed of an insulating film, on its side where a wiring pattern 3 is provided.

Specifically, FIGS. 1 and 2 show the construction of a conventional semiconductor device which is an object to be improved by the invention. A TAB tape 1 used in the semiconductor device comprises: a tape substrate 5 formed of a polyimide resin insulating film; a wiring pattern 3 which has been formed by bonding a copper foil onto one side of the tape substrate 5 through an adhesive 4 and photoetching the copper foil and has, on its one end, a bonding pad 10 for connection to a semiconductor and has, on its other end or in a portion between both ends thereof, a solder ball mounting pad 30; and an insulating film 2 in a predetermined PSR pattern which has been formed, on the surface of the wiring pattern 3 in the region of the solder ball mounting pad 30 while leaving a via hole 12 for a solder ball, by printing a photosolder resist resin by means of a printing plate on the wiring pattern 3 and subjecting the print to pattern exposure and development.

In the TAB tape 1 as a wiring tape for mounting a semiconductor element, for wire bonding purposes, a window hole is generally formed in the center portion by stamping, and the insulating film 2 is not formed in the portion of the bonding pad 10 on the tape substrate 5 and a region extended inward from the bonding pad 10.

In producing the semiconductor device, shown in FIG. 1, by using this TAB tape 1, a semiconductor chip 7 is applied through an adhesive 6 onto the tape substrate 5 in its side remote from the wiring pattern 3 (opposite side of the tape substrate 5), and an electrode 8 in the semiconductor chip 7 is electrically connected to the bonding pad 10 in the TAB tape through a bonding wire 9 formed of gold.

Next, the connection in the wire bonding, that is, the bonding lead portion, is sealed by a mold resin 11. Thereafter, solder balls 13 formed by reflow treatment are mounted respectively on the solder ball mounting pads 30 in such a manner that the solder balls 13 are arrayed in via holes 12 for solder balls.

According to this semiconductor device, a wiring pattern 3 is provided on the tape substrate in its side opposite to the side on which the semiconductor chip 7 in its element formation surface is put. This construction permits the element electrode 8 in the semiconductor chip 7 to be bonded to the wiring pattern 3 through the bonding wire 9 which is passed through the window hole 15. Therefore, the bonding wire 9 can be provided without being extended around the periphery of the semiconductor chip 7. This can eliminate the need to ensure, on the periphery of the semiconductor chip 7, a wiring space for the bonding wire 9 and thus can reduce the size and thickness of the whole device. Further, since wiring bonding can be carried out, a difference in coefficient of thermal expansion between the semiconductor element and the substrate can be absorbed by the bonding wire 9. This is advantageous, for example, in that an inexpensive resin substrate rather than an expensive ceramic substrate can be used.

However, it has been found that, in sealing the bonding lead portion by the mold resin, the mold resin spreads on the PSR pattern and flows into the via hole (PSR via) for a solder ball and, consequently, the solder ball disadvantageously comes off from the via hole.

SUMMARY OF THE INVENTION

Accordingly, it is an object of the invention to provide a BGA type semiconductor device which can solve the above problem of the prior art and can prevent the flow of a mold resin into a portion of a via hole for a solder ball through the provision of a groove.

It is another object of the invention to improve the effect of damming off a mold resin by a dam groove, which has been provided in such a form as not to expose the underlying wiring layer, and thus to improve the productivity of a tape carrier for a semiconductor device and a semiconductor device using the same.

According to the first feature of the invention, a BGA type semiconductor device comprises a BGA type interposer comprising: a tape substrate formed of a resin insulating film; a wiring pattern, formed of a metal foil, provided on one side of the tape substrate; a bonding pad, for connection to a semiconductor, provided on one end of the wiring pattern; a solder ball mounting pad provided on the other end of the wiring pattern or in a portion between both ends of the wiring pattern; an insulating film provided on the surface of the wiring pattern in the region of the solder ball mounting pad while leaving a via hole for a solder ball; a window hole for wire bonding of the bonding pad to an electrode in a semiconductor element; and a groove portion which is a smaller-thickness portion of the insulating film provided in a part of the insulating film, for preventing the flow of a mold resin into the via hole for a solder ball, a semiconductor element, provided with an electrode, mounted on the tape substrate, in the interposer, on its side remote from the wiring pattern, said electrode in the semiconductor element having been wire bonded to the bonding pad through the window hole, the connection between the bonding pad and the semiconductor element having been sealed with a mold resin by pouring the mold resin into the window hole while preventing the flow of the mold resin into the via hole for a solder ball by the groove portion, and a solder ball mounted on the solder ball mounting pad.

According to this construction, by virtue of the provision of a groove portion, which is a smaller-thickness portion of the insulating film in a part of the insulating film, for preventing the flow of the mold resin into the via hole for a solder ball, in pouring the mold resin into the window hole used in wire bonding to perform sealing, even when the mold resin, which has been poured into the window hole, is likely to flow into the via hole for a solder ball, in which the solder ball mounting pad is present, from the window hole side, the mold resin first flows into the groove portion, whereby the flow of the mold resin into the via hole for a solder ball can be prevented by the groove portion. Therefore, the solder ball mounting pad is always maintained in an exposed state without being covered by the mold resin, whereby the problem of coming-off of the solder ball mounted on the solder ball mounting pad can be prevented.

In the BGA type semiconductor device according to the first feature of the invention, preferably, the groove portion is provided between the bonding pad and the via hole for a solder ball.

Preferably, the interposer is a TAB tape such that the tape substrate is formed of a polyimide resin, the metal foil is a copper foil, and the insulating film is formed of a solder resist.

Further, in the BGA type semiconductor device according to the first feature of the invention, the groove portion may be linearly provided along the window hole. Alternatively, the groove portion may be wavily provided along the window hole.

Further, the groove portion may comprise a plurality of independent grooves which have been successively arranged in a broken line form.

The groove portion may comprise a plurality of groove portions, adjacent to each other, provided, between the bonding pad and the via hole for a solder ball, so as to extend along the longitudinal direction of the window hole.

According to the second feature of the invention, a tape carrier for a semiconductor device comprises:

a tape substrate formed of a resin insulating film;

a wiring pattern, formed of a metal foil, provided on one side of the tape substrate;

a bonding pad, for connection to a semiconductor, provided on one end of the wiring pattern;

a solder ball mounting pad provided on the other end of the wiring pattern or in a portion between two ends of the wiring pattern;

an insulating film provided on the surface of the wiring pattern in the region of the solder ball mounting pad while leaving a via hole for a solder ball;

a window hole for wire bonding of the bonding pad to an electrode in a semiconductor element; and a strip-shaped groove portion for preventing the flow of a mold resin into the via hole for a solder ball at the time of sealing, with a mold resin, of a connection between the bonding pad and a semiconductor element, formed in the wire bonding of the bonding pad to an electrode in the semiconductor element, said strip-shaped groove portion having a flat shape in section and being provided along the window hole on the surface of the insulating film present between the window hole and the via hole, for a solder ball, close to the window hole.

According to this construction, since a groove is provided as a strip-shaped groove, which is flat in section, on the surface of the insulating film along the window hole, the ability to prevent the flow of the mold resin into the via hole for a solder ball is larger than that in the case where a plurality of narrow grooves in a stripe form are provided. Therefore, the flow of the mold resin into the via hole for a solder ball can be more effectively prevented.

In the tape carrier according to the second feature of the invention, preferably, the strip-shaped groove portion has a roughened bottom face.

According to this construction, since the strip-shaped groove portion has a roughened bottom face, the flow of the mold resin into the via hole for a solder ball can be more effectively prevented than the case where the groove has a smooth bottom face.

In the tape carrier according to the second feature of the invention, preferably, the insulating film has been formed from photosensitive resin layer, and the strip-shaped groove portion has been formed in such a manner that, in the step of exposure of the photosensitive resin layer, a mask having minute light shielding portions arranged at given intervals is provided, the photosensitive resin layer is cured in a form conforming to the minute light shielding portions, and the photosensitive resin layer in its portion remaining uncured is removed by development.

The strip-shaped groove portion may have been mechanically formed with a cutting blade.

The insulating film may have been formed by printing or atomization application of a photosensitive resin or dipping in a photosensitive resin.

According to the third feature of the invention, a semiconductor device comprises:

the above tape carrier;

a semiconductor chip, provided with an electrode, applied through an adhesive to the tape substrate, in the tape carrier, in its side (opposite side) remote from the wiring pattern, said electrode having been electrically connected to the bonding pad as a part of the wiring pattern through a bonding wire;

a mold resin for sealing a connection between the bonding pad and the semiconductor chip; and a solder ball which has been mounted on the solder ball mounting pad in the via hole for a solder ball after the sealing of the connection with the mold resin.

According to the invention, by virtue of the provision of a strip-shaped groove portion, which is flat in section, on the surface of a part of the insulating film between the bonding pad and the via hole for a solder ball, along the window hole, for preventing the flow of the mold resin into the via hole for a solder ball, even when the mold resin, which has been poured into the window hole used in the wire bonding, is likely to flow into the via hole for a solder ball, in which the solder ball mounting pad is present, from the window hole side, the mold resin first flows into the strip-shaped groove portion, whereby the flow of the mold resin into the via hole for a solder ball can be prevented by the groove portion. In this case, since this groove portion is provided as a strip-shaped groove portion which is flat in section and thus has a large sectional area, the ability to prevent the flow of the mold resin into the via hole for a solder ball is very high.

This can prevent the mold resin from covering the solder ball mounting pad present at the bottom of the via hole, for a solder ball and, consequently, the solder ball mounting pad is always maintained in an exposed state, whereby the problem of coming-off of the solder ball mounted on the solder ball mounting pad can be prevented.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
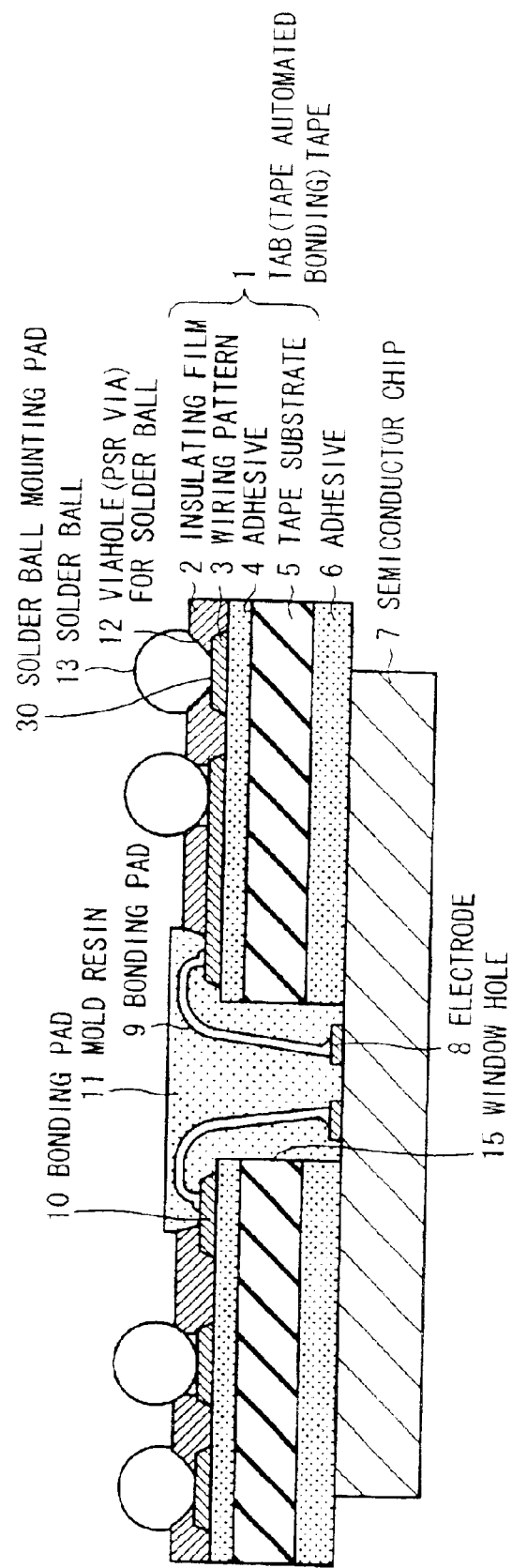
FIG. 1 is a cross-sectional view of a conventional semiconductor device using a TAB tape.
Figure 2:
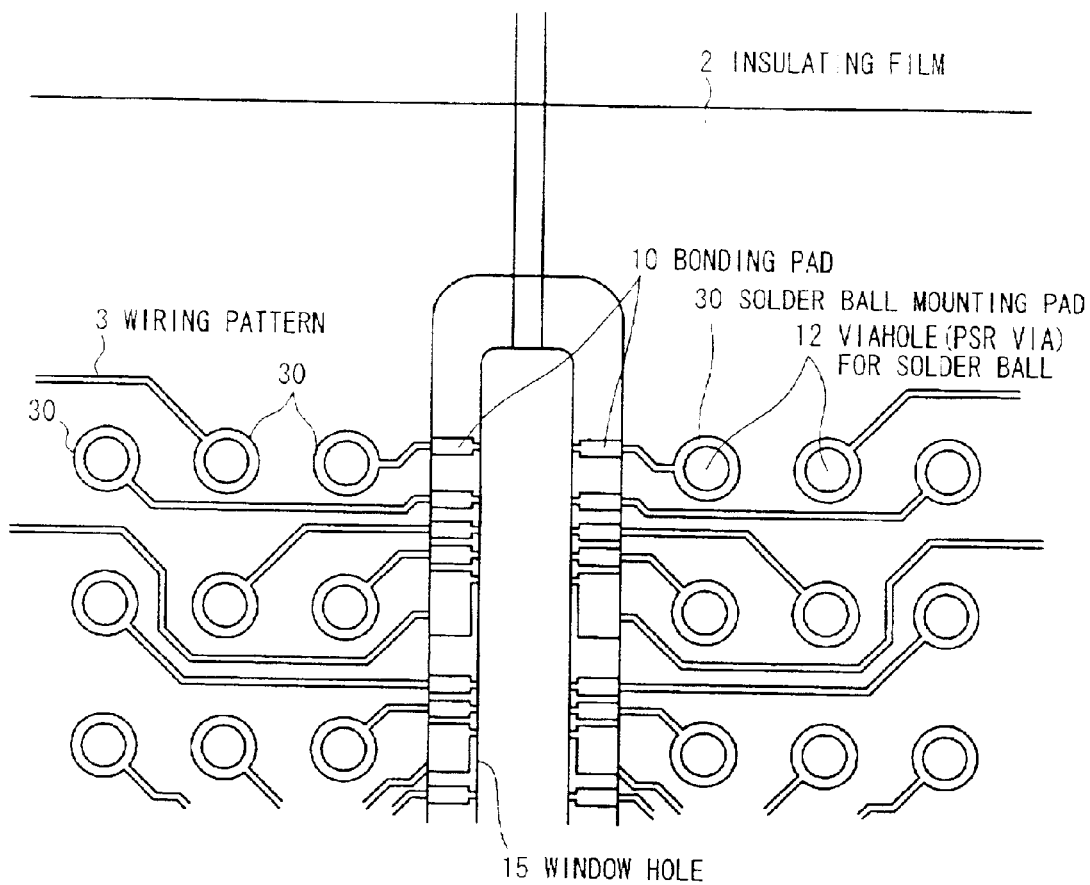
FIG. 2 is a plan view of the TAB tape, as viewed from PSR side, used in the conventional semiconductor device shown in FIG. 1.

Preferred embodiments of the invention will be explained in conjunction with the accompanying drawings, wherein like parts are identified with the same reference numerals.

BGA type semiconductor device according to first feature of invention

Preferred Embodiment 1

Figure 3:
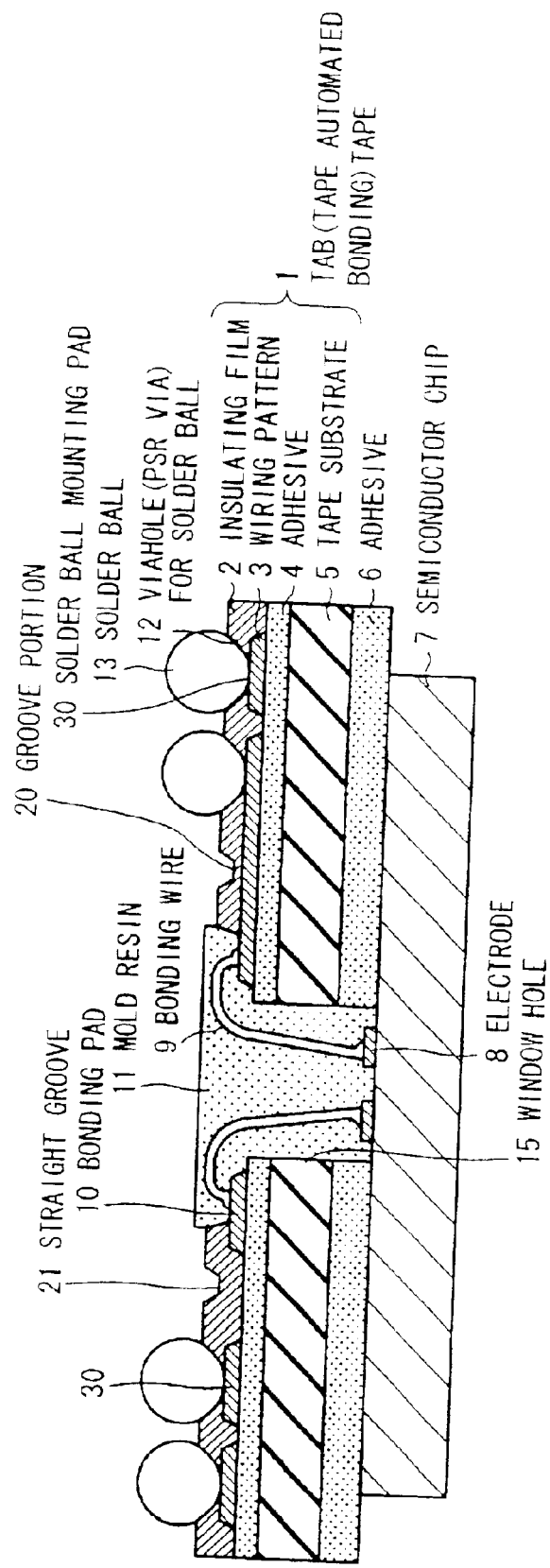
FIG. 3 is a cross-sectional view of a BGA type semiconductor in a first preferred embodiment of the first feature of the invention.
Figure 4:
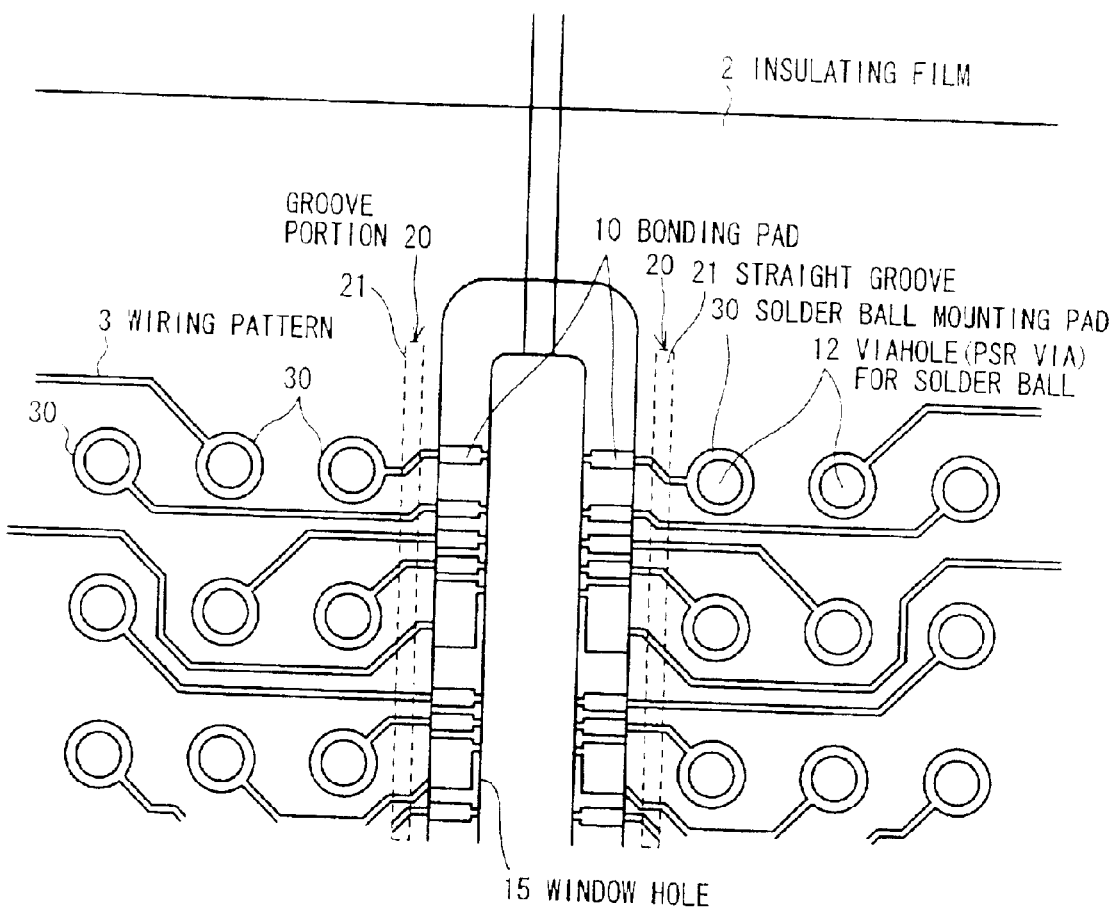
FIG. 4 is a plan view of a part of a BGA type TAB tape, as viewed from PSR side, used in the BGA type semiconductor device shown in FIG. 3.

FIG. 3 is a cross-sectional view of a BGA type semiconductor device using a BGA type TAB tape as an interposer between an LSI chip and an external terminal according to Preferred Embodiment 1 of the invention, and FIG. 4 is a partial plan view of a BGA type TAB tape, as viewed from photosolder resist (PSR) side, used in the BGA type semiconductor device shown in FIG. 3.

The BGA type semiconductor device shown in FIG. 3 utilizes a TAB tape as an interposer having the following construction.

Specifically, a TAB tape 1 used in the semiconductor device shown in the drawing comprises: a tape substrate 5 formed of a polyimide resin insulating film; a wiring pattern 3 which has been formed by bonding a copper foil as a metal foil onto one side of the tape substrate 5 through an adhesive 4 and photoetching the copper foil and has, on its one end, a bonding pad 10 for connection to a semiconductor and has, on its other end or in a portion between both ends thereof, a solder ball mounting pad 30; and an insulating film 2 in a predetermined photosolder resist (PSR) pattern which has been formed, on the surface of the wiring pattern 3 in the region of the solder ball mounting pad 30 while leaving a via hole 12, for a solder ball, corresponding to the solder ball mounting pad 30, by printing a photosolder resist resin by means of a printing plate on the wiring pattern 3 and subjecting the print to pattern exposure and development. This insulating film 2 covers the surface of the wiring pattern in its region of the solder ball mounting pad 30 and does not cover the portion of the bonding pad 10 and a region extended inward from the bonding pad 10. Therefore, the bonding pad 10 is in the state of exposure as with the solder ball mounting pad 30.

This TAB tape 1 is further provided with a groove portion between the bonding pad 10 and the via hole (PSR via) 12 for a solder ball. The groove portion 20 functions to prevent the flow of a mold resin 11 into the via hole 12 for a solder ball. The groove portion 20 is formed by forming the predetermined pattern in the insulating film (photosolder resist PSR) 2 so as for the thickness of the predetermined pattern to be partially thin in its portion between the bonding pad 10 and the via hole (PSR via) 12 for a solder ball. In this preferred embodiment, the groove portion 20 comprises straight grooves 21 provided parallel to each other on both respective sides of the window hole 15.

The step of PSR for forming the groove portion 20 comprises printing, exposure, and development. Specifically, the formation of the groove portion 20 may be performed as a part of the step of printing, exposure, and development for forming the predetermined pattern of the insulating film 2 formed of the photosolder resist, or alternatively may be formed by the step of exposure and development of the photosolder resist which is performed separately from the above step.

Figure 5:
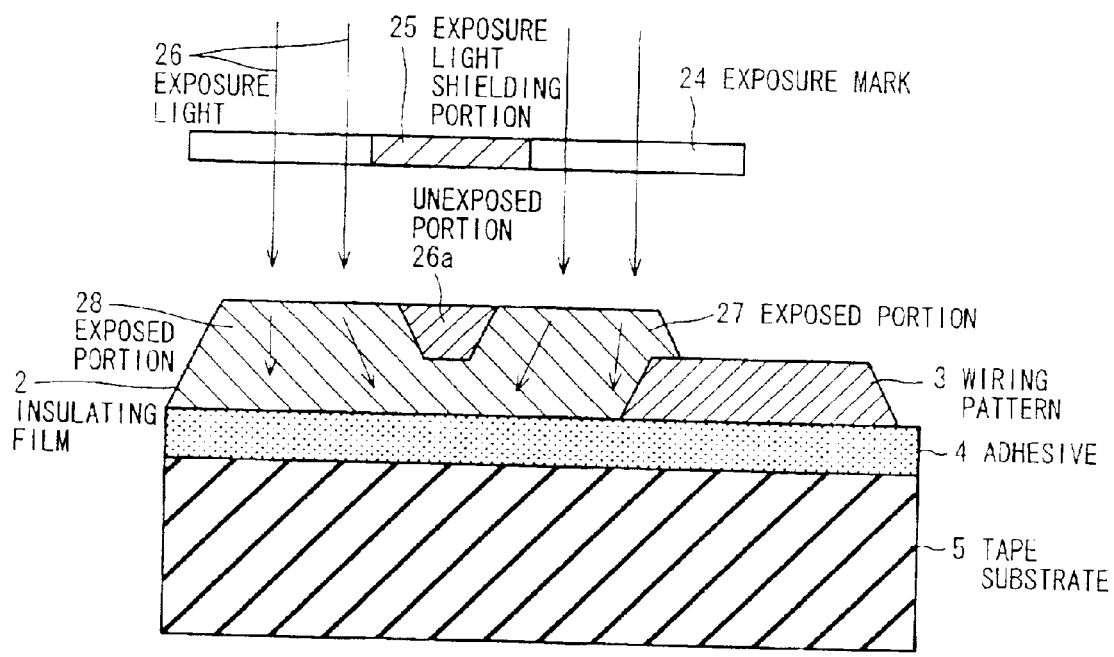
FIG. 5 is an explanatory view illustrating the step of exposure for forming a groove according to the first feature of the invention.

In the step of exposure involved in the formation of the groove portion 20 (PSR groove), as shown in FIG. 5, an exposure mask 24 having an exposure light shielding portion 25 corresponding to the photosolder resist of the insulating film 2 in its portion to be removed for the formation of the groove portion 20 is provided. Exposure light 26 is applied to the photosolder resist of the insulating film 2 from above the exposure mask 24 to perform over-exposure of the photosolder resist of the insulating film 2 through the utilization of sneak of the exposure light 26 from the exposure portion. In the PSR groove portion 20, PSR is cured by exposure light in its bent portion and, in addition, exposure light in its portion reflected from the underlying copper foil (wiring pattern 3). Thus, an unexposed portion 26a, corresponding to the groove portion 20, and exposed portions 27, 28 are formed in the photosolder resist of the insulating film 2. Next, in the step of development, the unexposed portion 26a is removed to form the groove portion 20 having a reversed trapezoidal or reversed triangular shape in section. In the preferred embodiment shown in FIG. 4, this groove portion 20 is provided, between the mold resin portion (mold resin 11) and the via hole (PSR via) 12 for a solder ball, as a straight groove 21 extended along the longitudinal direction of the widow hole 15.

Next, in the TAB tape 1, in an uncomplete state, comprising the tape substrate 5, the adhesive (for bonding a copper foil) 4, the wiring pattern 3, the insulating film 2, and the groove portion 20, or alternatively in the TAB tape 1, in an uncomplete state, comprising the above elements and, in addition, a semiconductor chip mounting adhesive 6, a connection window hole 15 for wire bonding of the bonding pad to a semiconductor element is formed by stamping. Thus, a complete TAB tape 1 as a BGA type interposer is provided. The formation of the widow hole 15 involved in the formation of the TAB tape 1 is carried out according to the following procedure. A portion, where a connection window hole for wire bonding of the bonding pad to a semiconductor chip 7 is to be formed, is predetermined on one side of the tape substrate 5 (this portion being hereinafter referred to as "predetermined portion for a window hole"). A wiring pattern 3 is formed, from a metal foil, on both sides of the predetermined portion for a window hole. A bonding pad 10 for semiconductor connection is formed on each wiring pattern 3 in its one end close to the predetermined portion for a widow hole, and, in addition, a solder ball mounting pad 30 is formed at the other end or in a portion between both ends of the wiring pattern 3, and an insulating film 2 is formed on the surface of the wiring pattern in the region of the solder ball mounting pad 30. Thereafter, stamping is carried out along the predetermined portion for a window hole to form a window hole 15.

Next, a semiconductor device is assembled using the above interposer. Specifically, in the semiconductor device according to this preferred embodiment, a semiconductor chip 7 is previously applied, with the aid of an elastomer adhesive 6, onto the tape substrate 5 in such a state that any copper foil pattern is not present. The bonding pad 4 is electrically connected by wire bonding using a bonding wire 9 of gold to the electrode 8 in the semiconductor chip 7 through the window hole 15. The connection between the bonding pad and the semiconductor chip is sealed with a mold resin 11. Further, solder balls 13 formed by reflow treatment are mounted on respective solder ball mounting pads 30 so as to be provided in an array form. Thus, a BGA type semiconductor device is prepared.

The sealing of the connection of the wire bonding between the bonding pad and the semiconductor chip is carried out by pouring the mold resin 11 into the window hole 15. In this case, by virtue of the provision of a groove portion 20, which is a smaller-thickness portion of the insulating film 2 provided in a part of the insulating film 2, between the bonding pad 10 and the via hole 12 for a solder ball, for preventing the flow of the mold resin into the via hole 12 for a solder ball, even when the mold resin 11, which has been poured into the window hole 15, is likely to flow into the via hole 12 for a solder ball from the window hole 15 side, the mold resin first flows into the groove portion 20, whereby the flow of the mold resin into the via hole 12 for a solder ball can be prevented by the groove portion 20. This can prevent the mold resin 11 from covering the solder ball mounting pad 30 present at the bottom of the via hole 12, for a solder ball and, consequently, the solder ball mounting pad 30 is always maintained in an exposed state, whereby the problem of coming-off of the solder ball 13 mounted on the solder mounting pad 30 can be prevented.

Other Preferred Embodiments and Variants

In the above preferred embodiment, in a part of the step of printing, exposure, and development of a solder resist for the formation of an insulating film 2 in a predetermined pattern, or alternatively in the step of exposure and development which is separately carried out after the formation of the insulating film 2, a groove portion 20 is formed, in the solder resist, as straight groove 21 along the window hole 15 to prevent the flow of the mold resin into the via hole. However, it should be noted that the groove portion 20 may be formed in various forms, in addition to the straight form, for example, wavy and broken line forms by the step of exposure and development of the solder resist.

Figure 6:
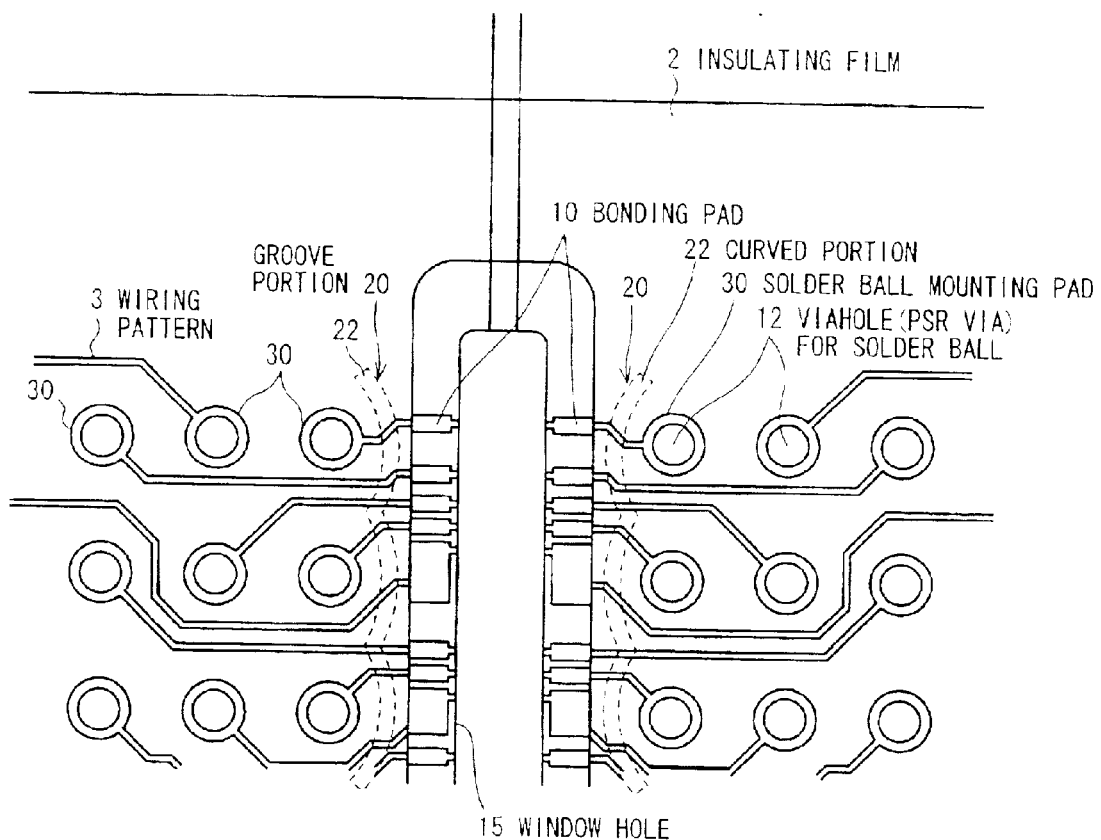
FIG. 6 is a partial plan view of a BGA type TAB tape in a semiconductor device in a second preferred embodiment of the first feature of the invention wherein a groove is wavily provided.

FIG. 6 shows a preferred embodiment of the invention wherein the groove portion 20, which is a smaller-thickness portion in a part of the insulating film 2, is wavily provided along the window hole 15. In this case, one curved portion 22 corresponds to one via hole 12 for a solder ball.

Figure 7:
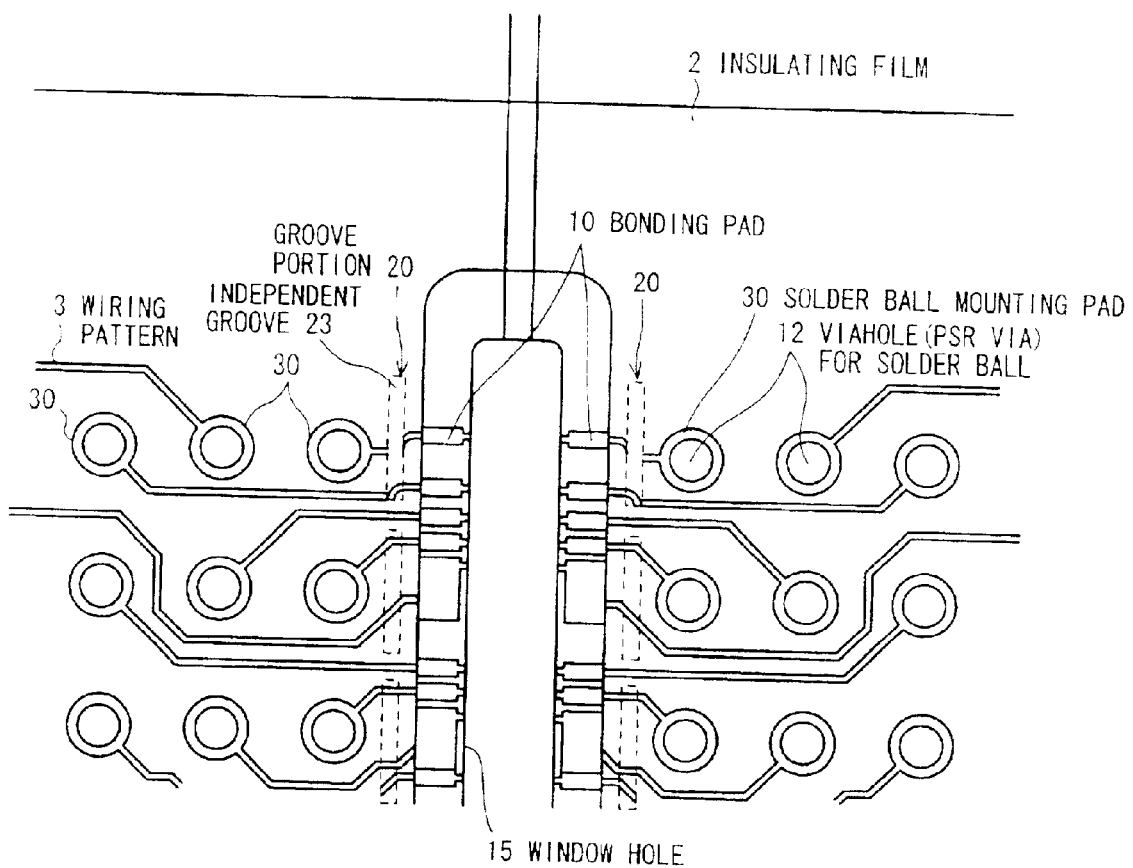
FIG. 7 is a partial plan view of a BGA type TAB tape in a semiconductor device in a third preferred embodiment of the first feature of the invention wherein a groove is provided in a broken line form.

FIG. 7 shows a preferred embodiment of the invention wherein the groove portion 20 comprises a plurality of independent grooves 23 which have been successively arranged in a broken line form. In this case, one independent groove 23 corresponds to one via hole 12 for a solder ball.

In the above preferred embodiments, only one groove portion 20 is provided in the solder resist PSR between the via hole 12 for a solder ball and the bonding pad 10. Alternatively, a plurality of groove portions adjacent to each other may be provided, between the bonding pad 10 and the via hole 12 for a solder ball, so as to extend along the longitudinal direction of the window hole.

As described above, according to the invention, by virtue of the provision of a groove portion, which is a smaller-thickness portion of the insulating film in a part of the insulating film, for preventing the flow of the mold resin into the via hole for a solder ball, in pouring the mold resin into the window hole used in wire bonding to perform sealing, even when the mold resin, which has been poured into the window hole, is likely to flow into the via hole for a solder ball from the window hole side, the mold resin first flows into the groove portion, whereby the flow of the mold resin into the via hole for a solder ball can be prevented by the groove portion. Therefore, the solder ball mounting pad is always maintained in an exposed state, whereby the problem of coming-off of the solder ball mounted on the solder ball mounting pad can be prevented.

Further, preventing the flow of the mold resin into the via hole for a solder ball can improve the yield in the assembly of semiconductor devices and thus can improve the productivity in the production of semiconductor devices.

Tape carrier for semiconductor device according to second feature of invention and semiconductor device according to third feature of invention Preferred Embodiment 1

Figure 8:
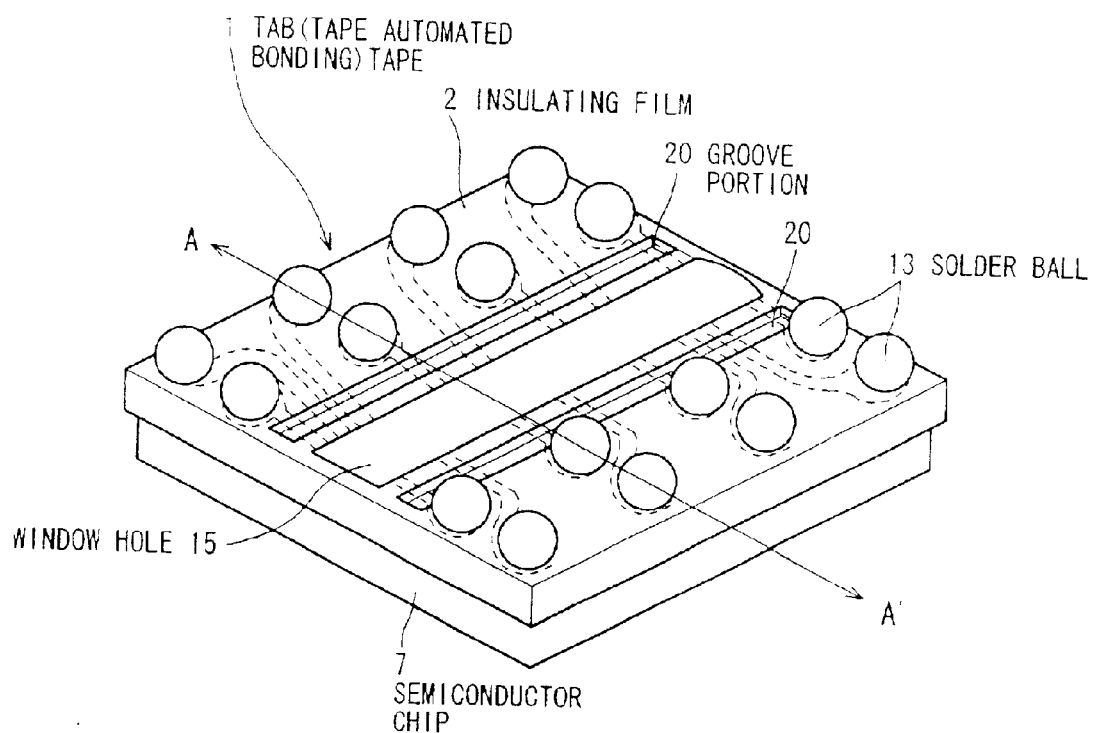
FIG. 8 is a perspective view of a semiconductor device having a PSR groove pattern in a first preferred embodiment of the second or third feature of the invention.
Figure 9:
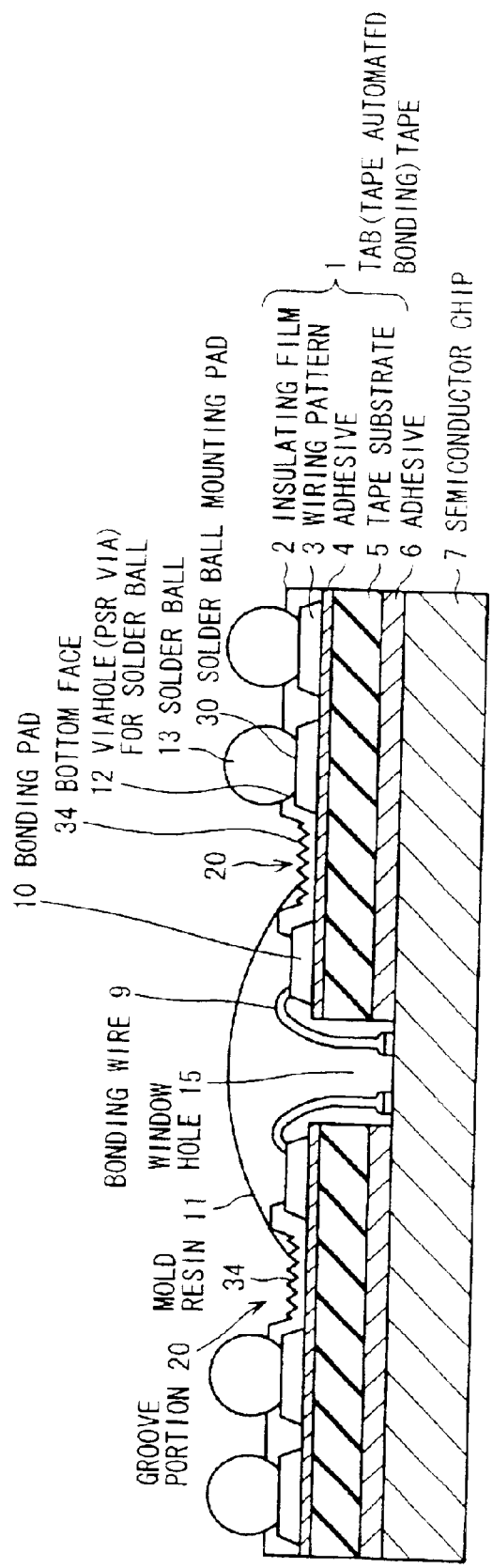
FIG. 9 is a cross-sectional view taken on line A–A' of FIG. 8.

FIG. 8 is a cross-sectional view of a BGA type semiconductor device using a TAB tape as an interposer between an LSI chip and an external terminal in a first preferred embodiment of the second or third feature of the invention, and FIG. 9 is an enlarged cross-sectional view taken on line A–A' of FIG. 8.

The BGA type semiconductor device shown in FIGS. 8 and 9 utilizes a TAB tape as an interposer having the following construction.

Specifically, a TAB tape 1 used in the semiconductor device shown in FIGS. 8 and 9 comprises: a tape substrate 5 formed of a polyimide resin insulating film; a wiring pattern 3 which has been formed by bonding a copper foil as a metal foil onto one side of the tape substrate 5 through an adhesive 4 and photoetching the copper foil and has, on its one end, a bonding pad 10 for connection to a semiconductor and has, on its other end or in a portion between both ends thereof, a solder ball mounting pad 30; and an insulating film 2 in a predetermined photosolder resist (PSR) pattern which has been formed by printing, on the surface of the wiring pattern 3 in the region of the solder ball mounting pad 30 while leaving a via hole 12, for a solder ball, corresponding to the solder ball mounting pad 30. This insulating film 2 covers the surface of the wiring pattern in its region of the solder ball mounting pad 30 and does not cover the portion of the bonding pad 10 and a region extended inward from the bonding pad 10. Therefore, the bonding pad 10 is in the state of exposure as with the solder ball mounting pad 30.

Further, in this TAB tape 1, a strip-shaped groove 20 having a flat shape in section is provided, along the window hole 15, on the surface of the insulating film 2 present between the window hole 18 and the via hole 12, for a solder ball, close to the window hole 18. This groove is constructed so as to prevent the flow of a mold resin into the via hole for a solder ball. To this end, the thickness of the predetermined pattern in the insulating film 2 is partially small in a portion between the bonding pad 10 and the via hole 12 for a solder ball. The strip-shaped groove 20 has a roughened bottom face 34. In this preferred embodiment, grooves 20 are linearly provided parallel to each other respectively on both sides of the window hole 15.

The strip-shaped groove 20 is formed as follows. In the step of exposure of the insulating film 2 formed of a photosensitive resin layer, a mask, wherein minute light shielding portions are arranged at given intervals, is provided, and the photosensitive resin layer is cured in a form conforming to minute light shielding portions. Thereafter, in the step of development, the photosensitive resin remaining uncured is removed.

FIG. 10 shows the step of PSR for the formation of the strip-shaped PSR groove 20. At the outset, as shown in FIG. 10B, a photosensitive resin for the formation of the insulating film 2 is printed on a wiring pattern 3 disposed through an adhesive 4 on a tape substrate 5 formed of an insulating film as shown in FIG. 10A.

Figure 10A:
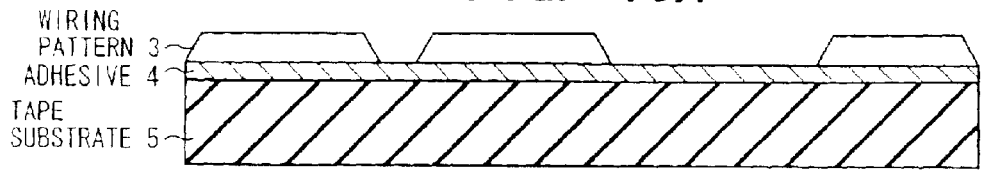
FIGS. 10A–10D are a cross-sectional view illustrating the step of PSR for forming a PSR groove according to the second of third feature of the invention.
Figure 10B:
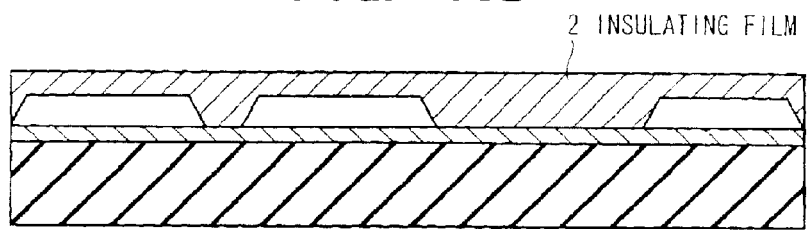
Figure 10C:
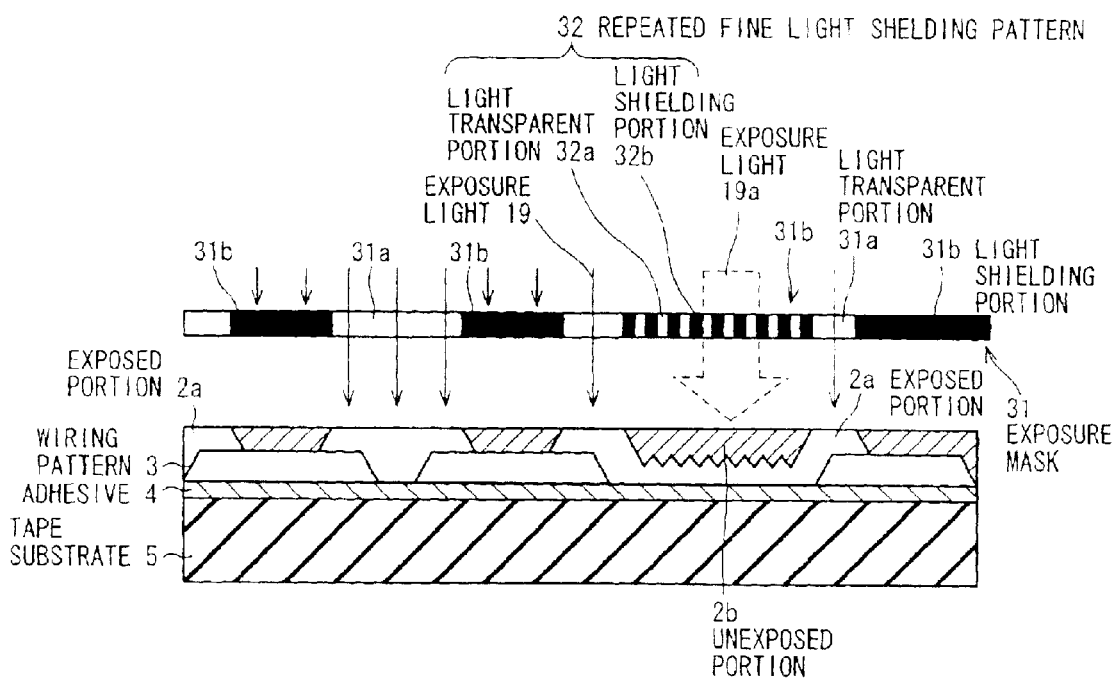
Figure 10D:
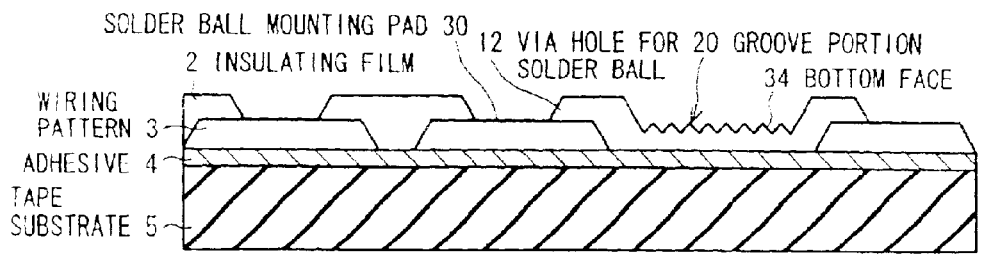

Next, in the step of exposure for the formation of a groove 20 (a PSR groove), as shown in FIG. 10C, an exposure mask 31 having a portion (a light transparent portion) 31a transparent to exposure light 19 and a portion (a light shielding portion) 31b, which shields light, is provided. Exposure light 19 is applied to the photosolder resist of the insulating film 2 from above the exposure mask 31 to expose the photosensitive resin. As a result, the photosensitive resin in its portion 2a, which has permitted the exposure light 19 to be passed therethrough and consequently has been exposed (non-hatched portion: exposed portion), is cured, whereas the photosensitive resin in its light shielded portion 2b (hatched portion: unexposed portion) is not cured. Therefore, in the step of development shown in FIG. 10D, upon the removal of the uncured photosensitive resin portion 2b (unexposed portion), the basic shape of the strip-shaped groove 20, which is flat in section, is obtained.

More specifically, in the invention, the step of exposure shown in FIG. 10C is carried out as follows. In the exposure mask 31, the light shielding portion 31b in its area corresponding to the groove 20 is provided as a repeated fine light shielding pattern portion 32 wherein fine light transparent portions 32a and fine light shielding portions 32b are repeatedly provided at given intervals in the widthwise direction of the groove 20. Exposure light 19a is applied from above this exposure mask 31 having the repeated fine light shielding pattern portion 32 to finely cure the photosensitive resin in its portion corresponding to the light shielding portion 32b in the repeated fine light shielding pattern portion 32, whereby a PSR groove 20 having a roughened bottom face 34 is formed. In this case, preferably, in the light shielding portion 31b corresponding to the groove 20, about 20 fine light shielding portions 32b are arranged at given intervals. The exposure light 19 in its portion reflected from the underlying copper foil (wiring pattern 3) and the adhesive layer 4 causes half exposure of the photosensitive resin in its portion corresponding to the repeated fine light shielding pattern portion 32 wherein only the bottom face 34 is cured. As a result, a PSR groove 20 is formed which has a roughened bottom face 34 and is flat in section.

Next, in the TAB tape 1, in an uncomplete state, comprising the tape substrate 5, the adhesive 4, the wiring pattern 3, the insulating film 2, and the groove 20, or alternatively in the TAB tape 1, in an uncomplete state, comprising the above elements and, in addition, a semiconductor chip mounting adhesive 6, a connection window hole 15 for wire bonding to a semiconductor element is formed by stamping. Thus, a complete TAB tape 1 as a BGA type interposer is provided. The formation of the widow hole 15 involved in the formation of the TAB tape 1 is carried out according to the following procedure. A portion, where a connection window hole for wire bonding of the bonding pad to a semiconductor chip 7 is to be formed, is predetermined on one side of the tape substrate 5 (this portion being hereinafter referred to as "predetermined portion for a window hole"). A wiring pattern 3 is formed, from a metal foil, on both sides of the predetermined portion for a window hole. A bonding pad 10 for semiconductor connection is formed on each wiring pattern 3 in its one end close to the predetermined portion for a widow hole, and, in addition, a solder ball mounting pad 30 is formed at the other end or in a portion between both ends of the wiring pattern 3, and an insulating film 2 is formed on the surface of the wiring pattern in the region of the solder ball mounting pad 30. Thereafter, stamping is carried out along the predetermined portion for a window hole to form a window hole 15.

Next, a semiconductor device is assembled using the above interposer. Specifically, in the semiconductor device according to this preferred embodiment, a semiconductor chip 7 is previously applied, with the aid of an elastomer adhesive 6, onto the tape substrate 5 in such a state that any copper foil pattern is not present. The bonding pad 4 is electrically connected by wire bonding using a bonding wire 9 of gold to the electrode 8 in the semiconductor chip 7 through the window hole 15. The connection between the bonding pad and the semiconductor chip is sealed with a mold resin 11. Further, solder balls 13 formed by reflow treatment are mounted on respective solder ball mounting pads 30 so as to be provided in an array form. Thus, a BGA type semiconductor device is prepared.

The sealing of the connection of the wire bonding between the bonding pad and the semiconductor chip is carried out by pouring the mold resin 11 into the window hole 15. In this case, by virtue of the provision of a strip-shaped groove 20, which is flat in section, on the surface of a part of the insulating film 2 between the bonding pad 10 and the via hole 12 for a solder ball, along the window hole 15, for preventing the flow of the mold resin 11 into the via hole 12 for a solder ball, even when the mold resin 11, which has been poured into the window hole 15, is likely to flow into the via hole 12 for a solder ball from the window hole 15 side, the mold resin first flows into the groove portion 20, whereby the flow of the mold resin into the via hole 12 for a solder ball can be prevented by the groove portion 20. Since this groove 20 is provided as a strip-shaped groove which is flat in section, the ability to prevent the flow of the mold resin into the via hole is larger than that in the case where a plurality of narrow grooves in a stripe form are provided. Therefore, the flow of the mold resin 11 into the via hole 12 for a solder ball can be more effectively prevented. This can prevent the mold resin 11 from covering the solder ball mounting pad 30 present at the bottom of the via hole 12, for a solder ball and, consequently, the solder ball mounting pad 30 is always maintained in an exposed state, whereby the problem of coming-off of the solder ball 13 mounted on the solder ball mounting pad 30 can be prevented.

Other Preferred Embodiments and Variants

Preferred Embodiment 2

Figure 11:
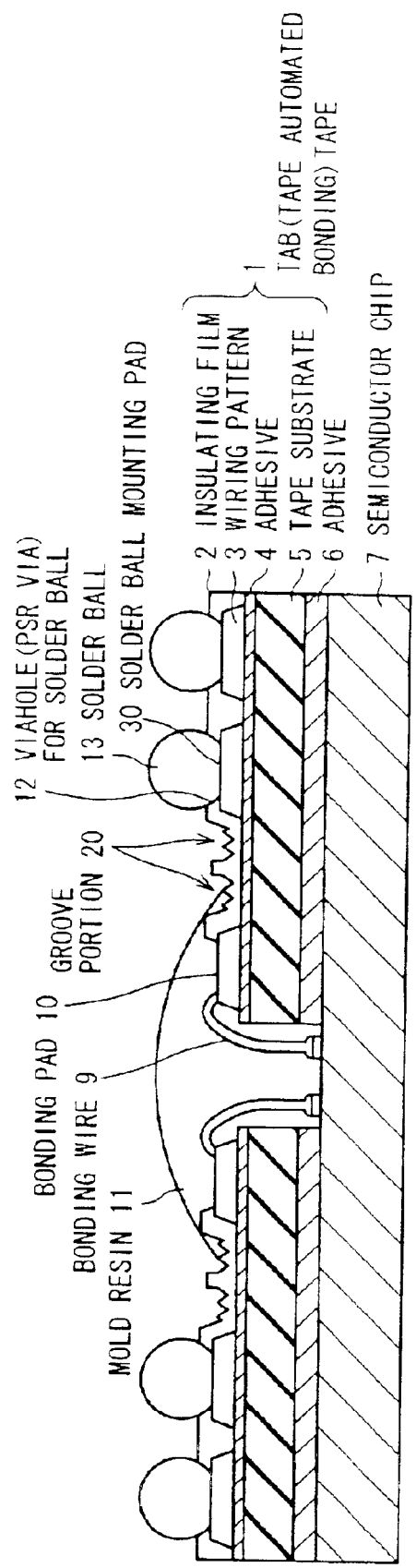
FIG. 11 is a cross-sectional view of a semiconductor device having a plurality of PSR grooves in a second preferred embodiment of the second or third feature of the invention.
Figure 12:
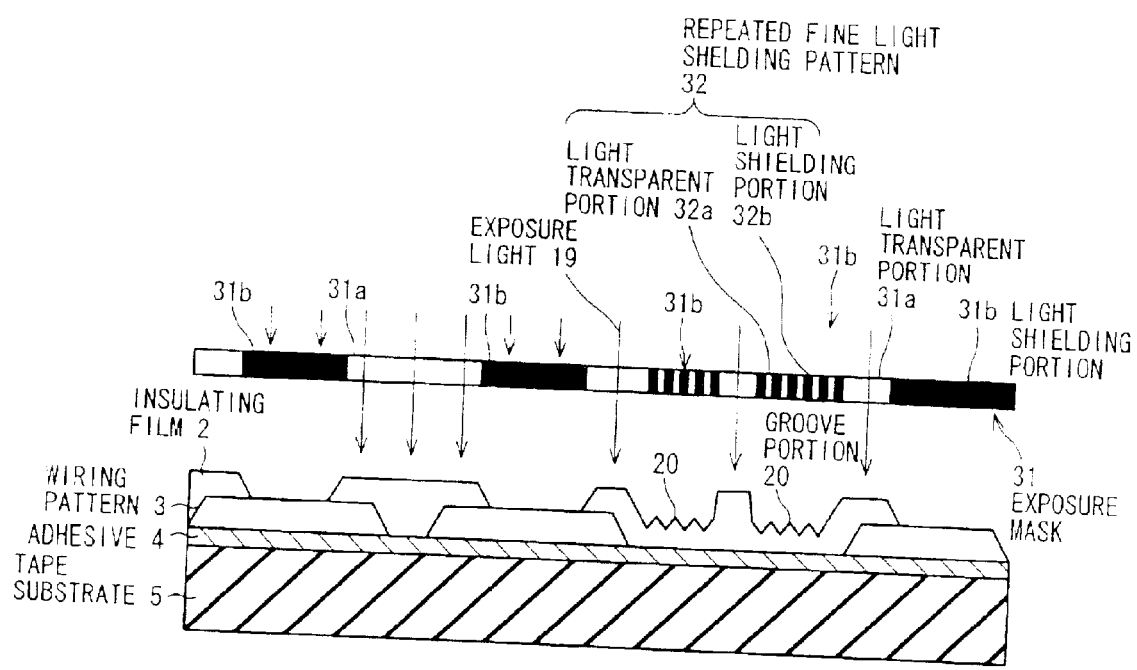
FIG. 12 is a cross-sectional view illustrating the step of exposure in the step of PSR for forming a plurality of PSR grooves shown in FIG. 11.

In Preferred Embodiment 1, on each side of the window hole 15, one strip-shaped PSR groove 20 having a flat shape in section is provided between the resin mold portion in the window hole 15 and the via hole 12 for a solder ball as the solder ball mounting portion. Alternatively, a plurality of grooves may be provided between the resin mold portion in the window hole 15 and the via hole 12 for a solder ball as the solder ball mounting portion. FIG. 11 shows an embodiment of the construction of a semiconductor device wherein, on each side of the window hole 15, two PSR grooves 20 are provided between resin mold portion and the solder ball mounting portion, and FIG. 12 shows a production process of the formation of the two PSR grooves 20.

Preferred Embodiment 3

Figure 13:
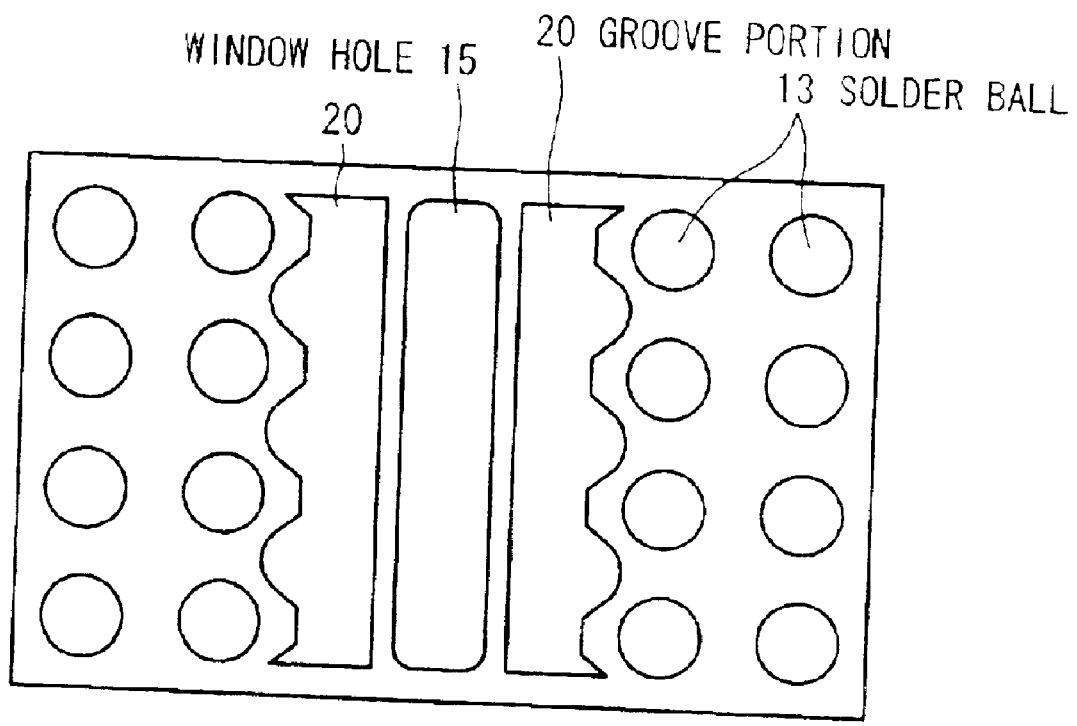
FIG. 13 is a top view of a semiconductor device in a third preferred embodiment of the second or third feature of the invention wherein a PSR groove is wavily provided along a solder ball mounting portion.

FIG. 13 shows an embodiment of the construction of a semiconductor device wherein the side periphery on the side of the via hole 12 for a solder ball in the PSR groove 20 having a roughened bottom face 34 is wavily formed along the solder ball mounting portion so that the mold resin 11 flows into between the solder balls along the groove 20.

Preferred Embodiment 4

Figure 14:
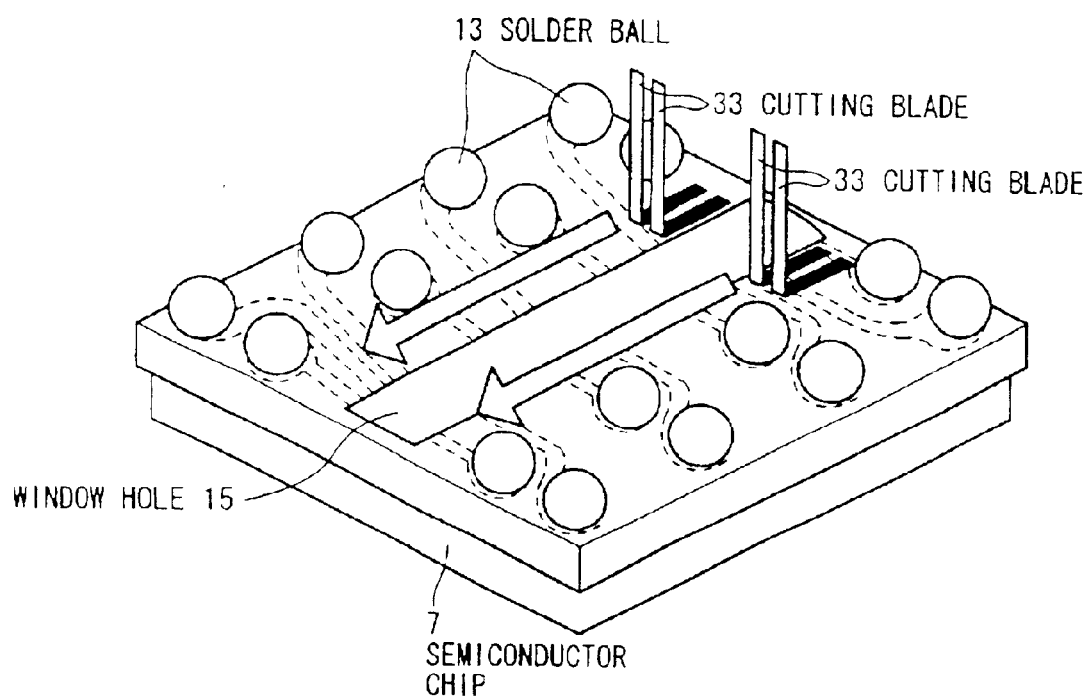
FIG. 14 is a typical view illustrating a fourth preferred embodiment according to the second or third feature of the invention wherein PSR grooves are mechanically formed with a cutting blade.

In the formation of the PSR groove 20, instead of the method wherein exposure light is partially shielded and PSR remaining uncured is removed by development, other methods may be used including a method, wherein the groove is mechanically formed, and a method wherein the groove is formed using a chemical. For example, as shown in FIG. 14, the groove 20 may be formed by means of a cutting blade 33.

Preferred Embodiment 5

In the formation of the insulating film 2, instead of the method wherein a photosensitive resin is coated by printing, other methods may be used including a method, wherein a liquid is atomized by a spray and applied, and a method wherein a portion to be coated is dipped in a resin contained in a tank.

As described above, according to the invention, since a strip-shaped groove, which is flat in section, for preventing the flow of a mold resin into a via hole for a solder ball is provided on the surface of the insulating film along the window hole, the ability to prevent the flow of the mold resin into the via hole for a solder ball is larger than that in the case where a plurality of narrow grooves in a stripe form are provided. Therefore, the flow of the mold resin into the via hole for a solder ball can be more effectively prevented.

By virtue of this, the effect of damming off a mold resin by the PSR groove can be improved, and, thus, the contamination of the solder ball mounting portion can be prevented. This contributes to improved yield in the assembly of semiconductor devices and improved productivity in the production of semiconductor devices.

The invention has been described in detail with particular reference to preferred embodiments, but it will be understood that variations and modifications can be effected within the scope of the invention as set forth in the appended claims.

What is claimed is:

1. A BGA type semiconductor device comprising:

(i) a BGA type interposer comprising:

a tape substrate formed of a resin insulating film;

a wiring pattern, formed of a metal foil, provided on one side of the tape substrate;

a bonding pad, for connection to a semiconductor, provided on one end of the wiring pattern;

a solder ball mounting pad provided on the other end of the wiring pattern or in a portion between both ends of the wiring pattern;

an insulating film provided on the surface of the wiring pattern in the region of the solder ball mounting pad while leaving a via hole for a solder ball;

a window hole for wire bonding of the bonding pad to an electrode in a semiconductor element;

a striped shaped groove portion which is a smaller-thickness portion of the insulating film provided in a part of the insulating film along the window hole and is formed between the window hole and the solder ball mounting pad, the striped shaped groove portion having a wall continuously formed on the side of the window hole, for preventing the flow of a mold resin into the via hole for a solder ball;

(ii) a semiconductor element, provided with an electrode, mounted on the tape substrate, in the interposer, on its side remote from the wiring pattern, said electrode in the semiconductor element having been wire bonded to the bonding pad thru the window hole, the connection between the bonding pad and the semiconductor element having been sealed with a mold resin by pouring the mold resin into the window hole while preventing the flow of the mold resin into the via hole for a solder ball by the groove portion; and (iii) a solder ball mounted on the solder ball mounting pad.

2. The BGA type semiconductor device according to claim 1, wherein the groove portion is provided between the bonding pad and the via hole for a solder ball.

3. The BGA type semiconductor device according to claim 1, wherein said interposer is a TAB tape such that the tape substrate is formed of a polyimide resin, the metal foil is a copper foil, and the insulating film is formed of a solder resist.

4. The BGA type semiconductor device according to claim 1, wherein the groove portion is linearly provided along the window hole.

5. The BGA type semiconductor device according to claim 4, wherein the groove portion comprises a plurality of independent groove which have been successively arranged in a broken line form.

6. The BGA type semiconductor device according to claim 4, wherein the groove portion comprises a plurality of groove portions, which is adjacent to each other, provided, between the bonding pad and the via hole for a solder ball, so as to extend along the longitudinal direction of the window hole.

7. The BGA type semiconductor device according to claim 1, wherein the groove portion is wavily provided along the window hole.

8. A BGA type interposer, comprising:

a tape substrate formed of a resin insulating film;

a wiring pattern, formed of a metal foil, provided on one side of the tape substrate;

a bonding pad, for connection to a semiconductor, provided on one end of the wiring pattern;

a solder ball mounting pad provided on the other end of the wiring pattern or in a portion between two ends of the wiring pattern;

an insulating film provided on the surface of the wiring pattern in the region of the solder ball mounting pad while leaving a via hole for a solder ball;

a window hole for wire bonding of the bonding pad to an electrode in a semiconductor element; and a striped shape groove portion which is a smaller-thickness portion of the insulating film provided in a part of the insulation film along the window hole and is formed between the window hole and the solder ball mounting pad, the striped shaped groove portion having a wall continuously formed on the side of the window hole, for preventing the flow of a mold resin into the via hole for a solder ball.

9. The BGA type interposer according to claim 8, wherein the strip-shaped groove portion has a roughened bottom face.

10. The BGA type interposer according to claim 8, wherein the insulating film has been formed from photosensitive resin layer, and the strip-shaped groove portion has been formed in such a manner that, in the step of exposure of the photosensitive resin layer, a mask having minute light shielding portions arranged at given intervals is provided, the photosensitive resin layer is cured in a form conforming to the minute light shielding portions, and the photosensitive resin layer in its portion remaining uncured is removed by development.

11. The BGA type interposer according to claim 8, wherein the strip-shaped groove portion has been mechanically formed with a cutting hole.

12. The BGA type interposer according to claim 8, wherein the insulating film has been formed by printing or atomization application of a photosensitive resin or dipping in a photosensitive resin.

13. A semiconductor device, comprising:

the BGA type interposer according to claim 8;

a semiconductor chip, provided with an electrode, applied thru an adhesive to the tape substrate, in the BGA type interposer, in its side (opposite side) remote from the wiring pattern, said electrode having been electrically connected to the bonding pad as a part of the wiring pattern thru a bonding wire;

a mold resin for sealing a connection between the bonding pad and the semiconductor chip; and a solder ball which has been mounted on the solder ball mounting pad in the via hole for a solder ball after the sealing of the connection with the mold resin.

14. A tape carrier for a semiconductor device, comprising:

a tape substrate having a first substrate surface, a second substrate surface opposed to the first substrate surface, and a first thru hole extending thru the first and the second substrate surfaces;

a wiring pattern on the first substrate surface having a first end proximate to the first thru hole and a second end distal to the first thru hole;

a bonding pad disposed at the first end of the wiring pattern:

a solder ball mounting pad disposed either (i) at the second end of the wiring pattern or (ii) between the first and the second ends of the wiring pattern; and an insulating layer on the wiring pattern, having (i) a first insulating layer surface distal to the wiring pattern, (ii) a second insulating layer surface proximate to the wiring pattern and opposed to the first insulating layer surface, (iii) a second thru hole extending thru the first and the second insulating layer surfaces, to the solder ball mounting pad, and (iv) a groove, in the first insulating layer surface, disposed between and distanced from the first thru hole and the second thru hole;

wherein the bonding pad is one of a plurality of bonding pads disposed at the first end of the wiring pattern;

wherein the solder ball mounting pad is one of a plurality of solder ball mounting pads disposed either (i) at the second end of the wiring pattern or (ii) between the first and the second ends of the wiring pattern;

wherein the second thru hole is one of a plurality of second thru holes extending thru the first and the second insulating layer surfaces, to the plurality of solder ball mounting pads;

wherein the first thru hole extends a first distance along a first longitudinal axis between a first end of the first thru hole and a second end of the first thru hole;

wherein the plurality of bonding pads are separated from each other in a direction parallel to the first longitudinal axis and separated from the first thru hole in a direction perpendicular to the first longitudinal axis;

wherein the plurality of solder ball mounting pads are separated from each other in a direction parallel to the first longitudinal axis and separated from the first thru hole in a direction perpendicular to the first longitudinal axis;

wherein the groove, in the first insulating layer surface, is disposed between and distanced from the plurality of bonding pads and the plurality of second thru holes, and continuously extends a second distance along a second longitudinal axis, parallel to the first longitudinal axis, between a first end of the groove and a second end of the groove; and wherein the second distance is not less than the first distance.

* * * * *